(12) United States Patent
Yang

(10) Patent No.: US 10,056,330 B2
(45) Date of Patent: *Aug. 21, 2018

(54) ELECTRICAL ANTIFUSE HAVING AIRGAP OR SOLID CORE

(71) Applicant: INTERNATIONAL BUSINESS MACHINES CORPORATION, Armonk, NY (US)

(72) Inventor: Chih-Chao Yang, Glenmont, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

This patent is subject to a terminal disclaimer.

(21) Appl. No.: 15/615,147

(22) Filed: Jun. 6, 2017

(65) Prior Publication Data

US 2018/0025977 A1    Jan. 25, 2018

Related U.S. Application Data

(63) Continuation of application No. 15/214,902, filed on Jul. 20, 2016, now Pat. No. 9,735,103.

(51) Int. Cl.
*H01L 23/52* (2006.01)
*H01L 23/525* (2006.01)
*H01L 21/768* (2006.01)

(52) U.S. Cl.
CPC .... *H01L 23/5252* (2013.01); *H01L 21/76879* (2013.01); *H01L 21/76886* (2013.01)

(58) Field of Classification Search
CPC ..... H01L 23/52; H01L 23/522; H01L 23/525; H01L 23/5252; H01L 45/04; H01L 45/06;
(Continued)

(56) References Cited

U.S. PATENT DOCUMENTS 5,536,947 A    7/1996 Klersy et al.
5,572,062 A    11/1996 Iranmanesh
(Continued)

FOREIGN PATENT DOCUMENTS

CN    101887883 B    12/2011
CN    103151332 B    1/2016

OTHER PUBLICATIONS

Disclosed Anonymously, "PCM Based Antifuse" IP.com No. IPCOM000229258D (Jul. 17, 2013) pp. 1-6.
(Continued)

*Primary Examiner* — Scott B Geyer
(74) *Attorney, Agent, or Firm* — Tutunjian & Bitetto, P.C.; Vazken Alexanian

(57) ABSTRACT

An antifuse structure including an opening through a dielectric material to a contact surface and an antifuse material layer present within the opening. The antifuse material layer may be a phase change material alloy of tantalum and nitrogen, wherein at least a base surface of the antifuse material layer is present on the contact surface and sidewall surfaces of the antifuse material layer are present on sidewalls of the opening through the dielectric material. An airgap or solid material core may be in the opening atop the base surface of the phase change material alloy. An electrically conductive material may be in direct contact with at least the antifuse material layer.

12 Claims, 5 Drawing Sheets

(58) Field of Classification Search
CPC .............. H01L 45/16; H01L 21/76879; H01L 21/76886
See application file for complete search history.

(56) References Cited

U.S. PATENT DOCUMENTS

| | | |
|---|---|---|
| 5,789,764 A | 8/1998 | McCollum |
| 5,789,795 A | 8/1998 | Sanchez et al. |
| 5,962,815 A | 10/1999 | Lan et al. |
| 6,124,194 A | 9/2000 | Shao et al. |
| 6,251,710 B1 | 6/2001 | Radens et al. |
| 6,335,228 B1 | 1/2002 | Fuller et al. |
| 6,603,142 B1 | 8/2003 | Ranaweera et al. |
| 6,713,369 B1 | 3/2004 | Ranaweera et al. |
| 7,390,726 B1 | 6/2008 | Issaq et al. |
| 7,557,424 B2 | 7/2009 | Wong et al. |
| 7,728,320 B2 | 6/2010 | Chen |
| 7,867,889 B2 | 1/2011 | Besling |
| 7,960,203 B2 | 6/2011 | Schrott et al. |
| 8,735,865 B2 | 5/2014 | Minemura et al. |
| 9,305,973 B2 | 4/2016 | Chung |
| 9,330,963 B2 | 5/2016 | King et al. |
| 9,735,103 B1 * | 8/2017 | Yang .................. H01L 23/5252 |
| 9,899,318 B2 | 2/2018 | Yang |
| 2006/0226409 A1 | 10/2006 | Burr et al. |
| 2008/0144355 A1 | 6/2008 | Boeve |
| 2013/0140513 A1 | 6/2013 | Lai et al. |
| 2013/0141967 A1 | 6/2013 | Cho |

OTHER PUBLICATIONS

List of IBM Patents or Patent Applications Treated as Related dated Jun. 6, 2017, 2 pages.
U.S. Office Action issued in related U.S. Appl. No. 15/703,279, dated Feb. 28, 2018, pp. 1-18.
U.S. Office Action issued in related U.S. Appl. No. 15/712,912, dated Feb. 28, 2018, pp. 1-12.
U.S. Office Action issued in related U.S. Appl. No. 15/432,342, dated Apr. 3, 2017, pp. 1-15.

* cited by examiner

ELECTRICAL ANTIFUSE HAVING AIRGAP OR SOLID CORE

BACKGROUND

Technical Field

The present disclosure relates to antifuse structures, and more particularly to antifuse structures including materials in which the resistance of the material may be adjusted.

Description of the Related Art

Antifuse structures have been used in the semiconductor industry for memory related applications such as, for example, field programmable gate arrays and programmable read-only memories. Most existing antifuse structures have a layer of antifuse material sandwiched in between two disconnected conductive materials. In such structures, the antifuse structure/circuit initially has a very high resistance, but after programming by electrical or optical means, the high resistance structure/circuit is converted to a lower resistance state.

SUMMARY

In one aspect, the present disclosure provides an antifuse structure that includes an antifuse material layer composed of an alloy of tantalum and nitrogen that changes from an insulating phase to an electrically conductive phase in response to thermal heating. In one embodiment, the antifuse structure includes an opening through a dielectric material to a contact surface and an antifuse material layer present within the opening in the dielectric. The antifuse material layer includes a phase change material alloy of tantalum and nitrogen. At least a base surface of the antifuse material layer is present on the contact surface, and sidewall surfaces of the antifuse material layer are present on sidewalls of the opening through the dielectric material. In some embodiments, an air gap is present in the opening atop the base surface of the phase change material alloy and between with sidewall surfaces of the antifuse material layer. An electrically conductive material is present in direct contact with at least the antifuse material layer. The electrically conductive material being positioned over the opening.

In another aspect of the present disclosure, an antifuse structure is provided that includes a solid core. In one embodiment, the antifuse structure includes an opening through a dielectric material to a contact surface, and an antifuse material layer present within the opening in the dielectric. The antifuse material layer may be a phase change material alloy of tantalum and nitrogen. At least a base surface of the antifuse material layer is present on the contact surface, and sidewall surfaces of the antifuse material layer may be present on sidewalls of the opening through the dielectric material. In one embodiment, a solid material core is present in the opening atop the base surface of the phase change material alloy and between with sidewall surfaces of the antifuse material layer. The antifuse structure may further include an electrically conductive material in direct contact with at least the antifuse material layer. The electrically conductive material is typically positioned over the opening.

In another embodiment, a method of forming an antifuse structure is provided, in which the antifuse material layer is composed of an alloy of tantalum and nitrogen that changes from an insulating phase to an electrically conductive phase in response to thermal heating. In one embodiment, the method may include forming at least one opening through an interlevel dielectric layer that extends to a contact for an electrical device, and depositing antifuse material layer comprising a phase change material alloy of tantalum and nitrogen. The antifuse material layer fills at least a portion of the opening. The phase change material is programmed thermally. A centralized positioned opening is patterned in the antifuse material layer. The opening formed in the antifuse material may be filled with a dielectric material to provide solid material core for the antifuse structure, or the opening may provide the site for forming an air gap. Thereafter, an electrically conductive material is formed atop the centralized positioned opening, wherein the electrically conductive material encapsulates a material core, e.g., solid core or airgap, in the opening in the antifuse material layer.

In another aspect of the present disclosure, a method of programming an antifuse structure is provided that includes providing an antifuse material layer including a phase change material alloy of tantalum and nitrogen in an opening through a dielectric layer to an electrical device. The phase change material alloy is formed with an insulating phase in an unprogrammed state. The antifuse material layer is contacted with an electrically conductive metal at a surface of the antifuse material layer that is opposite a surface of the antifuse material layer that is contacting the electrical device. The antifuse material may be thermally heated through the electrically conductive metal. Thermally heating the antifuse material changes crystal structure (and accordingly changes a nitrogen (N) to tantalum (Ta) ratio) in the antifuse material layer to provide electrical conductivity.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

Figure 1:
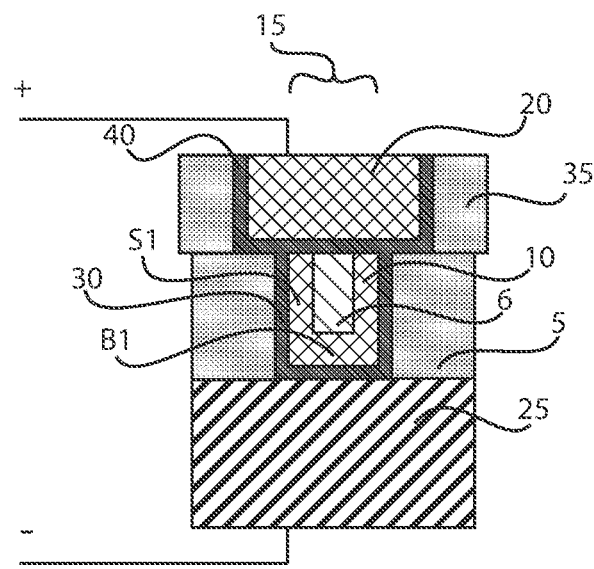
FIG. 1 is a side cross-sectional view depicting one embodiment of an antifuse structure including an antifuse material layer of a phase change alloy including tantalum and nitrogen that is present within an opening extending through a dielectric layer, wherein an air gap is centrally positioned within the opening, in accordance with one embodiment of the present disclosure.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The terms "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

The present disclosure provides an antifuse structure, and methods of forming an antifuse structure devices including material layers that exhibit changes in resistivity that correspond to phase changes. An "antifuse" is an electrical device that performs the opposite function to a fuse. Whereas a fuse starts with a low resistance and is designed to permanently break an electrically conductive path (typically when the current through the path exceeds a specified limit), an antifuse starts with a high resistance and can be designed to permanently create an electrically conductive path (typically when the voltage across the antifuse exceeds a certain level). Antifuse structures include a material which initially has a high resistance but can be converted into a lower resistance by the application of a certain process. An un-programmmed antifuse type gate array is programmed by causing a selected antifuse to become conductive.

It has been determined that the process for integrating antifuse structures with other devices in an integrated circuit typically requires extra masking and etching steps, which increases overall fabrication costs. It has also been determined that since the programming voltage for creating the electrical path in the antifuse is a function of the thickness of the antifuse layer, damage that is caused to the antifuse material resulting from over etch processes can result in de-programming states, which can result in product failure, i.e., the electrical path is not properly formed when the appropriate voltage is applied. Moreover, the voltage programming method requires a stacked multilayered structure in which a layer of antifuse material is positioned between two "disconnected" conductive materials in an orientation that may be referred to as "sandwiched". It has been determined that this geometry limits design flexibility and enlarges the area required for forming the antifuse material element.

In some embodiments, the methods and structures disclosed herein reduce manufacturing complexity of antifuse structures by providing antifuse structures without extra layers of antifuse materials. In some embodiments, the methods and structures disclosed herein include an antifuse material layer that is composed of an alloy of tantalum (Ta) and nitrogen (N). For example, the alloy of tantalum (Ta) and nitrogen (N) that may provide the antifuse material may be composed of tantalum nitride ($Ta_3N_5$). The alloys employed herein for the antifuse material are phase change materials. More specifically, the tantalum (Ta) and nitrogen (N) alloy that provides the antifuse material layer disclosed herein, is typically deposited at a phase that provides insulating properties, which provides the state of the antifuse before programming. Programming of the antifuse may include heating the antifuse material, e.g., by heating the surrounding electrodes, which can cause a phase change in the tantalum (Ta) and nitrogen (N) alloy to a higher conductivity phase. For example, while the $Ta_3N_5$ phase of the tantalum (Ta) and nitrogen (N) alloy has a high resistance typical of an insulator, the TaN phase of the tantalum (Ta) and nitrogen (N) alloy has a lower resistance typical of an electrical conductor. The $Ta_3N_5$ phase of the tantalum (Ta) and nitrogen (N) alloy may be referred to as an orthorhombic phase, which may be considered as a dielectric material. The TaN phase of the tantalum (Ta) and nitrogen (N) alloy may be referred to as a cubic or hexagonal phase, and may be considered an electrical conductor. Electrically conductive" and/or "electrical conductor" as used through the present disclosure means a material typically having a room temperature resistivity less than about 250 $\mu\Omega$-cm. As used herein, the terms "insulator" and "dielectric" denote a material having a room temperature resistivity greater than about 250 $\mu\Omega$-cm. The phase change from the insulating phases to the electrically conductive phases is induced by crystal structure change through heating. The conductivity of the anti-fuse element can be increased by changing phase of the tantalum (Ta) and nitrogen (N) alloy, e.g., cubic, hexagonal, through heating, e.g., by heating the conductive materials contacting the antifuse material, i.e., the antifuse material of tantalum (Ta) and nitrogen (N) alloy. The methods and structures of the present disclosure are now described with greater detail referring to FIGS. 1-10.

FIG. 1 depicts one embodiment of an antifuse structure 100 including an antifuse material layer 10 of a phase change alloy including tantalum and nitrogen that is present within an opening 15 extending through a dielectric layer 5. In some embodiments, the dielectric layer 5 is an interlevel dielectric layer that is present overlying a contact surface 25 to an electrical device, such as a semiconductor device, e.g., field effect transistor (FET), fin type field effect transistor (FinFET), metal oxide semiconductor field effect transistor (MOSFET), bipolar junction transistor, vertical finFET (V-FinFET); memory device, e.g., dynamic random access memory (DRAM), embedded dynamic random access memory (eDRAM), flash memory; and/or passive electronic devices, such as resistors and capacitors. In some examples, the contact surface 25 may be a gate structure or a source/drain region of a semiconductor device. The contact surface 25 may be any active region of a substrate to a semiconductor device. The opening 15 extends through the dielectric layer 5 to a portion of the contact surface 25 of the electronic device.

In some embodiments, a diffusion barrier layer 30 (also referred to as first diffusion barrier layer 30) is present on the sidewalls of the opening 15 that is extending through the dielectric layer 5. The first diffusion barrier layer 30 may composed of a material composition that obstructs the materials that are contained within the opening 15 from diffusing into the dielectric layer 5. For example, the first diffusion barrier layer 30 may be composed of tantalum nitride (TaN). In other examples, the first diffusion barrier layer 30 may be composed of Co, Ir, Rh, Pt, Pd, Ta, TaN, Ti, TiN, Ru, RuN, RuTa, RuTaN, W, WN and combinations thereof. In some embodiment, the diffusion barrier layer 30 may have a conformal thickness ranging from 1 nm to 10 nm.

The antifuse material layer 10 of the phase change alloy including tantalum (Ta) and nitrogen (N) is present entirely within the opening 15, and does not extend outside the opening 15. The antifuse material layer 10 is also a single layer, and not a multilayered structure. The single layer has a single composition of a tantalum (Ta) and nitrogen (N) alloy. By "phase change alloy" it is meant that the composition of the material layer can experience a change in phase from an electrically insulating phase to an electrically conductive phase. In some embodiments, the phase change may be induced thermally, e.g., by directly heating the phase change alloy. In some embodiment, the antifuse material layer 10 of the phase change alloy including tantalum (Ta) and nitrogen (N) is in a dielectric phase before programming. The dielectric phase of the antifuse material layer 10 of the phase change alloy including tantalum (Ta) and nitrogen (N) may be $Ta_3N_5$, which may be referred to as a dielectric material layer. When the alloy including tantalum (Ta) and nitrogen (N) is in a dielectric phase, e.g., when the alloy composition is $Ta_3N_5$, the crystal structure of the tantalum (Ta) and nitrogen (N) alloy may be orthorhombic, which can be considered a dielectric material. As will be described in greater detail below, in response to the application of heat, the antifuse material layer 10 of the phase change alloy including tantalum (Ta) and nitrogen (N) may be converted into an electrically conductive phase. The conversion to the electrically conductive phase may be referred to as programming. When programmed, the crystal structure of the antifuse material layer 10 of the phase change alloy including tantalum (Ta) and nitrogen (N) is changed, e.g., Cubic, hexagonal. TaN. TaN is electrically conductive, and may have a cubic or hexagonal phase.

In the embodiment that is depicted in FIG. 1A, the antifuse material layer 10 of a phase change alloy including tantalum (Ta) and nitrogen (N) includes at least one surface, i.e., base surface B1, that is atop the contact surface 25 of the underlying electrical device, and sidewall surfaces S1 that are present on the sidewall surface of the opening 15 extending through the dielectric layer 5.

Referring to FIG. 1, in some embodiments, an air gap 6 is present in the opening 15 atop the base surface B1 of the phase change material alloy 10 and between with sidewall surfaces S1 of the antifuse material layer 10. As used herein, an "air gap" means a void that is not filled with solid material. It may be filled with a liquid and/or a gas such as air. In the embodiment that is depicted in FIG. 1 the air gap is enclosed by an electrically conductive material 20 that is positioned atop and extending over the opening 15 through the dielectric layer 5, wherein the electrically conductive material 20 is in contact with at least a portion of the phase change material alloy 10. For example, the electrically conductive material 20 may be in direct contact with a sidewall surface S1 of the antifuse material layer 10.

The electrically conductive material 20 may be composed of a metal selected from copper (Cu), tungsten (W), aluminum (Al), cobalt (Co), rhodium (Rh), ruthenium (Ru), iridium (Ir), nickel (Ni) and combinations thereof. In some embodiments, the electrically conductive material 20 may be used to thermally heat the antifuse material layer 10 of a phase change alloy including tantalum (Ta) and nitrogen (N) to effectuate a phase change as required by device programming.

Still referring to FIG. 1, in some embodiments, the electrically conductive material 20 is a portion of a metal line present atop the opening 15 including the antifuse material layer 10. The metal line may be present in a trench that is formed in a second dielectric layer 35. In some embodiments, a diffusion barrier layer 40 (also referred as second diffusion barrier layer 40) is present between the electrically conductive material 20 for the metal line and the dielectric layer 35 that the trench for the metal line is formed in. The second diffusion barrier 40 is a conformal layer present on the sidewalls and base of the opening in the dielectric layer 35 for the metal line. In some embodiments, the second diffusion barrier 40 has a thickness ranging from 2 nm to 10 nm. In some examples, the second diffusion barrier layer 40 may be composed of Co, Jr, Rh, Pt, Pd, Ta, TaN, Ti, TiN, Ru, RuN, RuTa, RuTaN, W, WN and combinations thereof.

Figure 2:
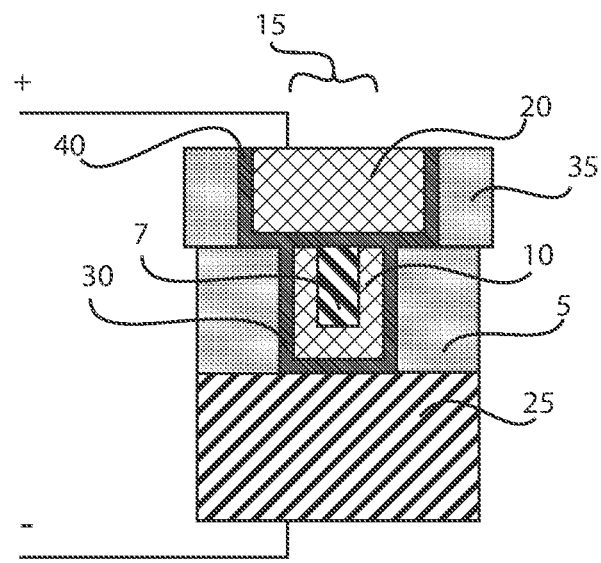
FIG. 2 is a side cross-sectional view depicting another embodiment of an antifuse structure including an antifuse material layer of a phase change alloy including tantalum and nitrogen that is present in the opening extending through a dielectric layer, wherein a solid material core is centrally positioned within the opening, in accordance with one embodiment of the present disclosure.

FIG. 2 depicts another embodiment of the present disclosure, in which an antifuse structure 100 is provided that includes an antifuse material layer 10 of the phase change alloy including tantalum (Ta) and nitrogen (N) and a solid material core 7. The antifuse material layer 10 depicted in FIG. 2 has been described above with reference to FIG. 1. In the embodiment that is depicted in FIG. 2, the centralized positioned opening that is patterned into the antifuse material layer 10 is filled with a solid material core 7. The solid material core 7 may be composed of any solid material. For example, the solid material core 7 may be composed of a dielectric, such as an oxide, e.g., silicon oxide; nitride, e.g., silicon nitride; and/or silicon oxynitride. In another embodiment, the solid core 7 may be composed of a metal, e.g. W, Al, Ti, Cu and/or alloys thereof. In some embodiments, the solid core 7 may be composed of a low-k dielectric material. In one embodiment, the low-k material that provides the dielectric solid core 7 may have a dielectric constant ranging from 1.0 to 3.5. In another embodiment, the low-k material that provides the dielectric solid core 7 may have a dielectric constant ranging from 1.75 to 3.2. Examples of materials suitable for the low-k dielectric material that provides the dielectric solid core 7 may include silicon carbon boron nitride (SiCBN), silicon oxycarbonitride (SiOCN), fluorine doped silicon dioxide, carbon doped silicon dioxide, porous silicon dioxide, porous carbon doped silicon dioxide, organosilicate glass (OSG), diamond-like carbon (DLC) and combinations thereof. In some embodiments, the dielectric solid core 7 may be composed of a high-k dielectric material. The term "high-k" as used to describe the material of the dielectric solid core 7 denotes a dielectric material having a dielectric constant greater than silicon oxide ($SiO_2$) at room temperature (20° C. to 25° C.) and atmospheric pressure (1 atm). For example, a high-k dielectric material may have a dielectric constant greater than 4.0. In another example, the high-k gate dielectric material has a dielectric constant greater than 7.0. In one embodiment, the solid material core 7 is composed of a high-k oxide, such as, for example, $HfO_2$, $ZrO_2$, $Al_2O_3$, $TiO_2$, $La_2O_3$, $SrTiO_3$, $LaAlO_3$, $Y_2O_3$ and mixtures thereof. Other examples of high-k dielectric materials for the dielectric solid core 7 include hafnium silicate, hafnium silicon oxynitride or combinations thereof. The solid material core 7 can also be metals, for example, W, Ti, Al, Cu and/or alloys.

In one embodiment, the device depicted in FIG. 2 further includes a dielectric layer 5, atop an electrical device (depicted as the contact surface 25 for the electrical device), wherein an opening 15 extends through the dielectric layer 5 to a contact surface of the electrical device 25. A first diffusion barrier 30 is present on the sidewalls and a base of the opening 15 that contains the antifuse material layer 10. An electrically conductive material 20 that can provide a metal line is present in direct contact with at least the sidewall surfaces S1 of the antifuse material layer 10. The electrically conductive material layer 20 extends over the antifuse material layer 10, the solid material core 7 and the dielectric layer 5. It is noted that the first diffusion barrier layer 30, the contact surface 25, dielectric layer 5 and the electrically conductive material 20 (second electrically conductive material) that are depicted in FIG. 2 have been described above in the description of the structures depicted in FIG. 1 having the same reference numbers. Still referring to FIG. 2, the antifuse structure may further include a second dielectric layer 35 and second diffusion barrier 40, which have also been describe above in FIG. 1.

Some methods for forming the structures depicted in FIGS. 1 and 2 are now discussed in greater detail with reference to FIGS. 3-10.

Figure 3:
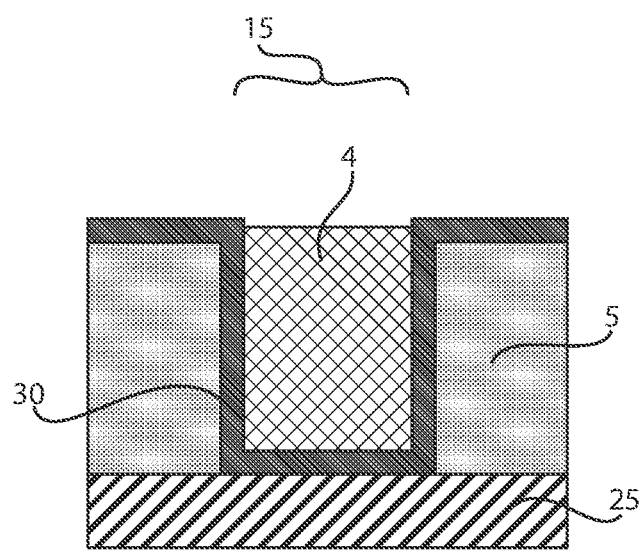
FIG. 3 is a side cross-sectional view of a via contact through a dielectric layer to an electrical device, in accordance with one embodiment of the present disclosure.

FIG. 3 illustrates one embodiment of a via contact 50 through a dielectric layer to an electrical device. The via contact 50 depicted in FIG. 3 can be to any component of an electrical device, such as a semiconductor device, e.g., field effect transistor (FET), fin type field effect transistor (FinFET), metal oxide semiconductor field effect transistor (MOSFET), bipolar junction transistor, vertical finFET (V-FinFET); memory device, e.g., dynamic random access memory (DRAM), embedded dynamic random access memory (eDRAM), flash memory; and/or passive electronic devices, such as resistors and capacitors. The via contact 50 may provide an initial structure for forming an antifuse structure 100. The via contact 50 typically includes an electrically conductive material 4 that is present in a via opening 15 through a dielectric layer 5 that extends to a contact surface 25 of an underlying electronic device. The electrically conductive material 4 of the via contact 50 may be composed of a metal selected from copper (Cu), tungsten (W), aluminum (Al), cobalt (Co), rhodium (Rh), ruthenium (Ru), iridium (Ir), nickel (Ni) and combinations thereof. The dielectric layer 5 as depicted in FIG. 3 is similar to the dielectric layer 5 that has been described above with reference to FIG. 1. In some embodiments, the dielectric layer 5 may be an oxide, nitride or oxynitride material. In other embodiments, the dielectric layer 5 may be an organosilicate glass (OSG), fluorine doped silicon dioxide, carbon doped silicon dioxide, porous silicon dioxide, porous carbon doped silicon dioxide, spin-on organic polymeric dielectrics (e.g., SILK™), spin-on silicone based polymeric dielectric (e.g., hydrogen silsesquioxane (HSQ) and methylsilsesquioxane (MSQ), or combinations thereof. The dielectric layer 5 may be formed atop the contact surface 25 of the electrical device using chemical vapor deposition (CVD). Forming the opening 15 through the dielectric layer 5 can include photolithography and etch processes. In some embodiments, a diffusion barrier layer 30 may be formed on the sidewalls and the base of the opening 15 before filling the opening with the electrically conductive material 6. The diffusion barrier layer 30 depicted in FIG. 3 has been described above with reference to FIG. 1. The diffusion barrier layer 30 may be deposited using chemical vapor deposition, such as plasma enhanced chemical vapor deposition (PECVD). Following formation of the diffusion barrier layer 30, the remainder of the opening 15 may be filled with the electrically conductive material 4. The electrically conductive material 4 may be deposited using chemical vapor deposition (CVD) or physical vapor deposition (PVD). Examples of CVD suitable for depositing the electrically conductive material 4 include plasma enhanced chemical vapor deposition (PECVD) or metal organic chemical vapor deposition (MOCVD). Examples of PVD suitable for depositing the electrically conductive material may include plating, electroplating, electroless plating, sputtering and combinations thereof.

In some embodiments, after filling the opening 15 with the electrically conductive material 4, the structure may be planarized, e.g., planarized using chemical mechanical planarization (CMP). The via contact 50 depicted in FIG. 3 may be employed as an initial structure for forming the antifuse structures 100 depicted in FIGS. 1 and 2. In some embodiments, the antifuse structures may be integrated into an interlevel dielectric layer 5 that includes also via contacts 50 that are not processed to provide antifuse structures 100, so an interlevel dielectric layer 5 can contain both via contacts 50 and antifuse structures 100 overlying the same substrate, which can include one or multiple electronic devices. To selectively process some of the via contacts 50 for forming the antifuse structures block masks may be employed, such as photoresist masks. In other embodiments, an antifuse structure 100, as depicted in FIGS. 1 and 2, may be formed independently of the via contacts 50. In this example, an opening 15 may be formed through a dielectric layer 5 to the contact surface 25 of an electrical device, and a diffusion barrier layer 30 may be formed in the opening 15 without filling the opening with the electrically conductive material 4 that is employed for the contact structures. This structure may provide the initial processing point for forming an antifuse structure 100, as depicted in FIGS. 1 and 2, by following the process sequence that is described with reference to FIGS. 5-10.

Figure 4:
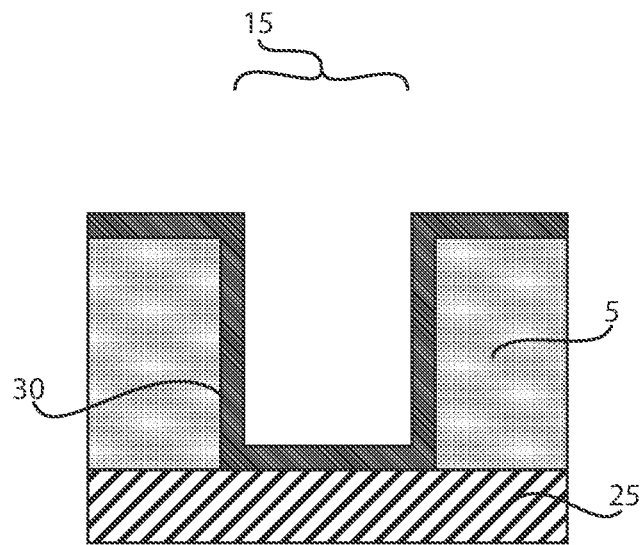
FIG. 4 is a side cross-sectional view of recessing the electrically conductive material of a via contact structure within a via opening through a dielectric layer to an underlying contact to an electrical device, in accordance with one embodiment of the present disclosure.

FIG. 4 depicts one embodiment of removing the electrically conductive material 4 of a via contact structure 50 as depicted in FIG. 3 within a via opening 15 through a dielectric layer 5 to an underlying contact 25 to an electrical device for forming an antifuse structure 100. The electrically conductive material 4 may be removed by an etch process. For example, the electrically conductive material 4 may be removed by an etch process that is selective to the interlevel dielectric 5. As used herein, the term "selective" in reference to a material removal process denotes that the rate of material removal for a first material is greater than the rate of removal for at least another material of the structure to which the material removal process is being applied. For example, in one embodiment, a selective etch may include an etch chemistry that removes a first material selectively to a second material by a ratio of 100:1 or greater. In some examples, the electrically conductive material 6 may be recessed by an etch process that is also selective to the first diffusion barrier 30. The etch process for recessing the electrically conductive material 6 may be an anisotropic etch process, such as reactive ion etch (RIE). In other embodiments, the etch process for recessing the electrically conductive material 6 may be an isotropic etch, such as a wet chemical etch.

Figure 5:
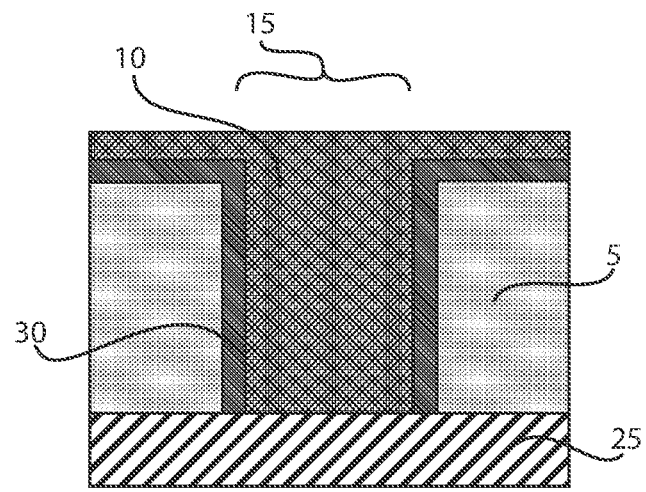
FIG. 5 is a side cross-sectional view of forming an antifuse material layer of a phase change alloy of tantalum and nitrogen in the via opening that is depicted in FIG. 4.

FIG. 5 depicts one embodiment of forming the antifuse material layer 10. FIG. 5 depicts forming an antifuse material layer 10 of a phase change alloy of tantalum and nitrogen, in which the antifuse material layer fills an entirety of the via opening 15. The antifuse material layer 10 is deposited using a deposition method, such as chemical vapor deposition (CVD) or atomic layer deposition (ALD). Chemical vapor deposition (CVD) is a deposition process in which a deposited species is formed as a result of chemical reaction between gaseous reactants at greater than room temperature (25° C. to 900° C.); wherein solid product of the reaction is deposited on the surface on which a film, coating, or layer of the solid product is to be formed. Variations of CVD processes include, but not limited to, Atmospheric Pressure CVD (APCVD), Low Pressure CVD (LPCVD) and Plasma Enhanced CVD (PECVD), Metal-Organic CVD (MOCVD) and combinations thereof may. "Atomic layer deposition" (ALD) as used herein refers to a vapor deposition process in which numerous consecutive deposition cycles are conducted in a deposition chamber. Typically, during each cycle a metal precursor is chemisorbed to the deposition surface; excess precursor is purged out; a subsequent precursor and/or reaction gas is introduced to react with the chemisorbed layer; and excess reaction gas (if used) and by-products are removed. "Chemisorption" and "chemisorbed" as used herein refer to the chemical adsorption of vaporized reactive precursor compounds on the deposition surface. In some examples, the adsorbed species are bound to the deposition surface as a result of relatively strong binding forces characterized by high adsorption energies (>30 kcal/mol), comparable in strength to ordinary chemical bonds. The chemisorbed species can limited to the formation of a monolayer on the deposition surface. In atomic layer deposition, one or more appropriate reactive precursor compounds are alternately introduced (e.g., pulsed) into a deposition chamber and chemisorbed onto the deposition surface. Each sequential introduction of a reactive precursor compound is typically separated by an inert carrier gas purge. Each precursor compound co-reaction adds a new atomic layer to previously deposited layers to form a cumulative solid layer. It should be understood, however, that atomic layer deposition can use one precursor compound and one reaction gas. As compared to the one cycle chemical vapor deposition process, the longer duration multi-cycle atomic layer deposition process allows for improved control of layer thickness by self-limiting layer growth and minimizing detrimental gas phase reactions by separation of the reaction components. Atomic layer deposition is similar in chemistry to chemical vapor deposition, except that the atomic layer deposition reaction breaks the chemical vapor deposition reaction into two half-reactions, keeping the precursor materials separate during the reaction.

In some embodiments, the antifuse material layer 10 of the phase change alloy including tantalum (Ta) and nitrogen (N) is deposited from at temperatures ranging from 200 to 375° C. using atomic layer deposition (ALD) or chemical vapor deposition (CVD). In some embodiments, pentakis (dimethylamino)tantalum (PDMAT) can be used as a tantalum source with either ammonia or monomethylhydrazine (MMH) as a nitrogen co-reactant. In some other embodiments, the tantalum source may be a precursor composed of TBTDMT (Ta(=NtBu)(NMe$_2$)$_3$) in combination with a nitrogen source provided by $N_2/H_2$ (or $NH_3$) plasma or a $H_2$ plasma. In this example the $N_2/H_2$ (or $NH_3$) plasma produces an insulating phase, and the $H_2$ plasma produces an electrically conductive phase.

In other embodiments, the tantalum (Ta) source may be composed of Tris(diethylamido)(tert-butylimido) tantalum and hydrazine. The tantalum (Ta) source may also TaCl$_5$ that is employed with a nitrogen source of $NH_3$. In some embodiments employing TaCl$_5$, the precursor gas may be accompanied with a zinc source, trimethylaluminum (TMA) or hydrogen radials to reduce tantalum V to tantalum III. Nitrogen sources may also include tert-butylamine, alylamine, 1,1-dimethylhydrazine and combinations thereof.

In some embodiments, the tantalum (Ta) source may also be provided by pentakis(dimethylamino)tantalum (PDMAT), pentakis(ethylmethylamino) tantalum (PEDMAT), (tert-butylimido)tris(ethylmethylamino)tantalum (TBTMET), (tert-butylimido) tris(diethylamido)tantalum (TBTDET) and combinations thereof.

The antifuse material layer 10 of the phase change alloy including tantalum (Ta) and nitrogen (N) is typically deposited in an insulating/dielectric phase. For example, the antifuse material layer 10 of the phase change alloy including tantalum (Ta) and nitrogen (N) may be deposited having a $Ta_3N_5$ composition, which may have an orthorhombic crystalline structure. In other embodiments, the antifuse material layer 10 of the phase change alloy including tantalum (Ta) and nitrogen (N) may be deposited having a $Ta_4N_5$ composition, which may have a tetragonal crystalline structure. In some embodiments, the controlling the gas flow of the nitrogen source can provide the preferred stoichiometry. For example, in some embodiments, an antifuse material layer 10 of phase change alloy including tantalum (Ta) and nitrogen (N) may be deposited having a $Ta_3N_5$ composition and an orthorhombic crystalline structure, in which the $N_2$ gas flow may range from 500 sccm to 5000 sccm. In some embodiments, the antifuse material layer 10 of phase change alloy including tantalum (Ta) and nitrogen (N) may be deposited having a $Ta_3N_5$ composition and an orthorhombic crystalline structure, when the $N_2$ gas flow ranges from 1500 sccm to 3000 sccm. Following deposition of the antifuse material layer 10 of phase change alloy including tantalum (Ta) and nitrogen (N), the structure may be planarized so that the upper surface of the antifuse material 10 is substantially coplanar with the upper surface of the dielectric layer 5.

Figure 6:
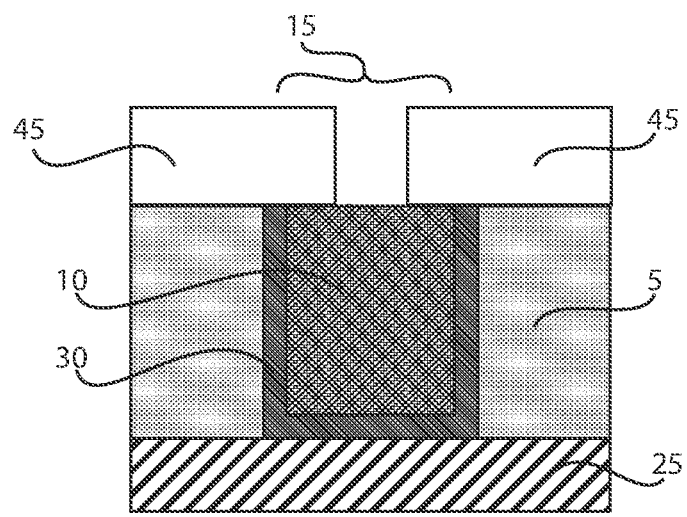
FIG. 6 is a side cross-sectional view depicting forming an etch mask atop the antifuse material layer, in accordance with another embodiment of the present disclosure.
Figure 7:
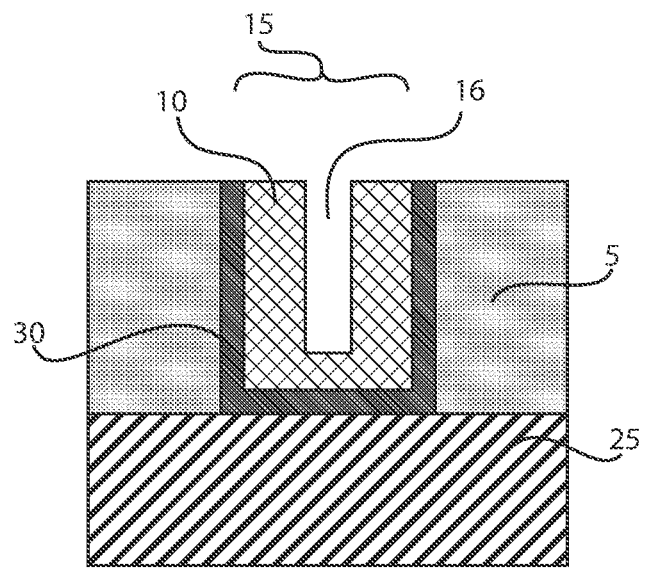
FIG. 7 is a side cross-sectional view depicting one embodiment of etching the electrically conductive material to pattern a centralized positioned opening into the electrically conductive material, in accordance with one embodiment of the present disclosure.

FIG. 6 depicts one embodiment of forming an etch mask 45 atop the antifuse material layer 10. The etch mask 45 may be formed using photolithography. The lithographic process can include forming a photoresist layer atop the antifuse material layer 10 that is present in the opening 15, exposing the photoresist to a desired pattern of radiation and developing the exposed photoresist utilizing a conventional resist developer. The pattern is then transferred into the antifuse material layer 10 by etching to form an opening 16, as depicted in FIG. 7. The etching can include a dry etching process (such as, for example, reactive ion etching, ion beam etching, plasma etching or laser ablation), and/or a wet chemical etching process. For example, in one embodiment, an anisotropic etch process, such as reactive ion etching (RIE), can be used to etch the antifuse material layer 10 within the via opening 15 that is depicted in FIG. 7 to provide a remaining portion of the antifuse material layer 10 having vertically orientated sidewalls S1 and a base surface B1 with a centrally positioned opening 16. After patterning the antifuse material layer 10, the patterned photoresist mask 45 can be removed utilizing a conventional stripping process such as, for example, selective etching and/or oxygen ashing.

Figure 8:
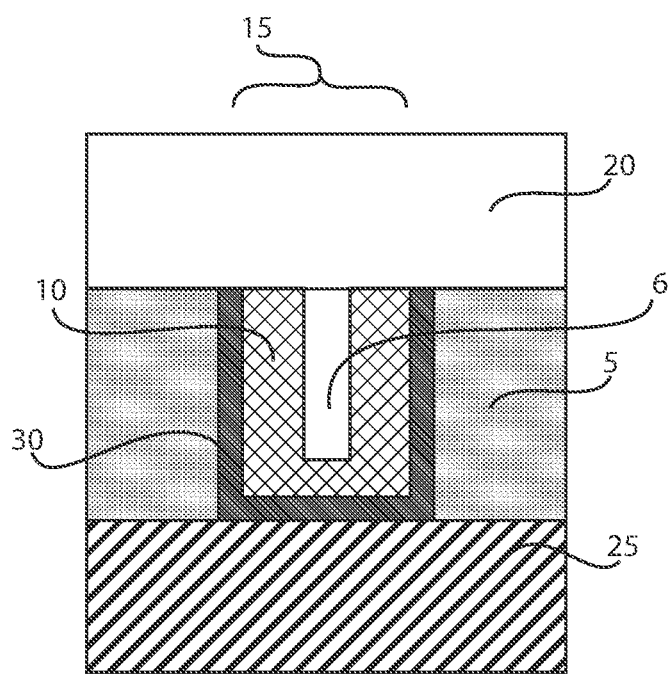
FIG. 8 is a side cross-sectional view depicting forming an electrically conductive material atop the centralized positioned opening that has been patterned into the electrically conductive material that is depicted in FIG. 7, wherein the electrically conductive material encapsulates an airgap, in accordance with one embodiment of the present disclosure.

In one embodiment, the centrally positioned opening 16 is sealed off by depositing an overlying material layer to provide an air gap 7, as depicted in FIG. 8. For example, in some embodiments, an electrically conductive material layer 20 for a metal line may be deposited atop the opening 15 sealing off the air gap 7. The electrically conductive material layer 20 may be in direct contact with at least the antifuse material layer 10, e.g., may be in direct contact with the sidewall surfaces S1 of the antifuse material layer 10. The electrically conductive material layer 20 may be composed of any metal. For example, the electrically conductive material layer 10 may be may be composed of a metal selected from copper (Cu), tungsten (W), aluminum (Al), cobalt (Co), rhodium (Rh), ruthenium (Ru), iridium (Ir), nickel (Ni) and combinations thereof. The electrically conductive material layer 10 may be deposited using physical vapor deposition (PVD), e.g., plating, electroplating, electroless plating, sputtering and combinations thereof; or chemical vapor deposition, e.g., plasma enhanced chemical vapor deposition (PECVD) or metal organic chemical vapor deposition (MOCVD).

In some embodiments, the electrically conductive material layer 10 may provide a metal line that is present within a trench formed in a dielectric layer 35, as depicted in FIG. 1. In some embodiments, the dielectric layer 35 may be an oxide, nitride or oxynitride material. In other embodiments, the dielectric layer 35 may be a organosilicate glass (OSG), fluorine doped silicon dioxide, carbon doped silicon dioxide, porous silicon dioxide, porous carbon doped silicon dioxide, spin-on organic polymeric dielectrics (e.g., SILK™), spin-on silicone based polymeric dielectric (e.g., hydrogen silsesquioxane (HSQ) and methylsilsesquioxane (MSQ), or combinations thereof. The dielectric layer 35 may be deposited using chemical vapor deposition (CVD). Following forming the dielectric layer 35, trench opening for the metal lines may be patterned and etched in the dielectric layer 35. For example, the trench openings may be formed using photolithography and etch processes. In some embodiments, a diffusion barrier layer 40 may be formed on the sidewalls and the base of the trench openings for the metal lines before filling the opening with the electrically conductive material 20. The diffusion barrier layer 40 depicted in FIG. 4 has been described above with reference to FIG. 1. The diffusion barrier layer 40 may be deposited using chemical vapor deposition, such as plasma enhanced chemical vapor deposition (PECVD). Following formation of the diffusion barrier layer 40, the remainder of the trench may be filled with the electrically conductive material 20. The electrically conductive material 20 may be deposited using chemical vapor deposition (CVD) or physical vapor deposition (PVD). Examples of CVD suitable for depositing the electrically conductive material 20 include plasma enhanced chemical vapor deposition (PECVD) or metal organic chemical vapor deposition (MOCVD). Examples of PVD suitable for depositing the electrically conductive material may include plating, electroplating, electroless plating, sputtering and combinations thereof. In some embodiments, after filling the opening 15 with the electrically conductive material 20, the structure may be planarized, e.g., planarized using chemical mechanical planarization (CMP).

Figure 9:
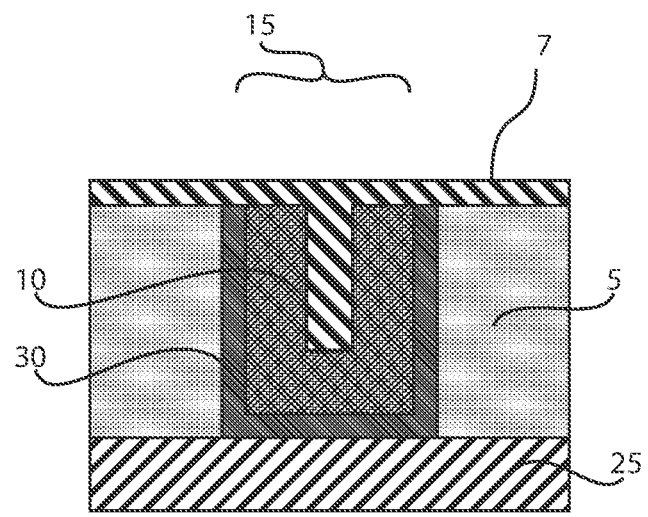
FIG. 9 is a side cross-sectional view depicting forming a material layer for a solid core in the centralized positioned opening that has been patterned into the electrically conductive material that is depicted in FIG. 7.
Figure 10:
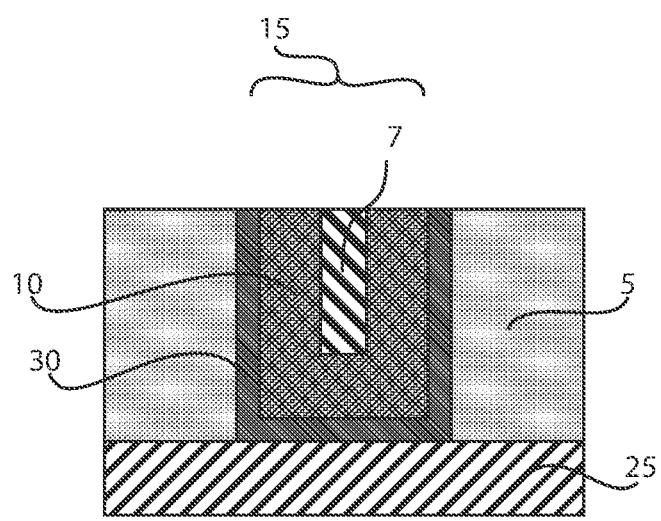
FIG. 10 is a side cross-sectional view depicting planarizing the material layer for the solid core that is depicted in FIG. 9.

FIGS. 9 and 10 depict another embodiment of the present disclosure, in which the centrally positioned opening 16 that is depicted in FIG. 7 is subsequently filled with the solid material core 7. The composition of the solid material core 7 has been provided above in the description of the material core depicted in FIG. 2.

FIG. 9 depicts forming a material layer 7 for the solid core in the centralized positioned opening 16 that has been patterned into the electrically conductive material that is depicted in FIG. 7. The material layer 7 for the solid core may be formed using a deposition process that may include chemical vapor deposition, dip coating, spin-coating, brush coating, chemical solution deposition, physical vapor deposition, and combinations thereof. Examples of chemical vapor deposition processes suitable for forming the dielectric material layer 7 may include, but are not limited to, Atmospheric Pressure CVD (APCVD), Low Pressure CVD (LPCVD) and Plasma Enhanced CVD (PECVD), Metal-Organic CVD (MOCVD) and combinations thereof. The deposition process may continue until the material layer 7 fills the centralized positioned opening 16 and may continue until the material layer 7 extends outside of the centralized positioned opening 16, as depicted in FIG. 9.

FIG. 10 depicts planarizing the material layer 7 for the solid core that is depicted in FIG. 9. The material layer 7 for the solid core may be planarized until the upper surface of the remaining material layer 7 is coplanar with the upper surface of the dielectric layer 5. The planarization process typically removes the portion of the material layer 7 for the solid core that extends over the dielectric layer 5. The planarization process may include chemical mechanical planarization (CMP).

In a following process step, a metal line including an electrically conductive material 20 within a trench in a dielectric layer 35 may be formed atop the opening 15 containing the antifuse material layer 10 and the solid material core 7, as depicted in FIG. 2. The electrically conductive material layer 20 may be in direct contact with at least the antifuse material layer 10, e.g., may be in direct contact with the sidewall surfaces S1 of the antifuse material layer 10. The metal line including the dielectric layer 35, the electrically conductive material layer 20 and the second diffusion barrier 40 that is depicted in FIG. 2 is similar to the metal line that has been described above with reference to FIG. 1. Therefore, the above description of forming the metal line including the dielectric layer 35, electrically conductive material layer 20 and the second diffusion barrier 40 that is provided above with reference to FIG. 1 is suitable for forming the metal line including the components having the same reference numbers that are depicted in FIG. 2.

In some embodiments, the present disclosure provides a method of programming an antifuse structure 100. The method of programming the antifuse may include providing an antifuse structure 100 as described above with reference to FIGS. 1-10, which includes an antifuse material layer 10 including a phase change material alloy of tantalum and nitrogen in an opening through a dielectric layer to an electrical device. In some embodiments, the phase change material alloy of the antifuse material layer 10 is first formed having an insulating phase. The antifuse material layer 10 is typically contacted with at least one electrically conductive metal 20 at a surface of the antifuse material layer 10 that is opposite a surface of the antifuse material layer that is contacting the electrical device. In some embodiments, programming the antifuse material layer 10 may include thermally heating the antifuse material layer 10 through at least the electrically conductive metal 20. Thermally heating the antifuse material layer 10 can change crystal structure (and accordingly change a nitrogen (N) to tantalum (Ta) ratio) in the antifuse material layer 10 to convert the antifuse material layer from its insulating phase to an electrically conductive phase. For example, programming the antifuse structure may include thermally heating the antifuse material layer 10 to cause a phase change from an insulating orthorhombic crystal structure, e.g., $Ta_3N_5$ composition to an electrically conductive cubic or hexagonal crystal structure, e.g., TaN composition. In some embodiments, thermal heating to program the antifuse structure may induce a phase change from an insulating phase to an electrically conductive phase at a temperature ranging from 500° C. to 900° C. In another embodiment, thermal heating to program the antifuse structure may induce a phase change from an insulating phase to an electrically conductive phase at a temperature ranging from 550° C. to 650° C. In one example, thermal heating to program the antifuse structure may induce a phase change from an insulating phase to an electrically conductive phase at a temperature of 600° C. In some embodiments, the antifuse structure employed in this programming method may have an air gap 6, as depicted in FIG. 1, or a solid material core 7, as depicted in FIG. 2.

Having described preferred embodiments of antifuse structures and methods of forming antifuse structures (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. An antifuse structure comprising:
   an antifuse material layer present within in an opening in a dielectric material, the antifuse material layer comprising a phase change material alloy, wherein at least a base surface of the antifuse material layer is present on the contact surface and sidewall surfaces of the antifuse material layer are present on sidewalls of the opening through the dielectric material;
   an air gap present in the opening atop the base surface of the phase change material alloy; and
   an electrically conductive material in contact with at least the antifuse material layer.

2. The antifuse structure of claim 1, wherein the phase change material alloy has dielectric properties and an orthorhombic phase prior to said antifuse structure being programmed.

3. The antifuse structure of claim 2, wherein the phase change material having said dielectric properties is comprised of a metal nitride material having a cubic phase when electrically conductive.

4. The antifuse structure of claim 1, wherein the phase change material alloy has electrically conductive properties and a cubic or hexagonal phase following said antifuse structure being programmed.

5. The antifuse structure of claim 4, wherein the phase change material alloy includes tantalum.

6. The antifuse structure of claim 1, wherein the phase change material alloy has electrically conductive properties and a cubic phase following said antifuse structure being programmed.

7. A method of forming an antifuse:
   forming at least one opening through an interlevel dielectric layer that extends to a contact for an electrical device;
   depositing antifuse material layer comprising a phase change material alloy, wherein the antifuse material layer fills at least a portion of the opening, wherein the phase change material is programmed thermally;
   patterning a opening in the antifuse material layer; and
   depositing an electrically conductive material atop the opening.

8. The method of claim 7, wherein the phase change material alloy is an insulator before programming.

9. The method of claim 7, wherein depositing the antifuse material comprises a chemical vapor deposition (CVD) process, wherein the CVD process includes a nitrogen containing gas with a flow rate ranging from 500 sccm to 5000 sccm.

10. The method of claim 7, wherein said programmed thermally comprises heating the antifuse material layer to a temperature ranging from 500° C. to 900° C.

11. The method of claim 7 further comprising an electrically conductive material is in direct contact with the phase change material alloy, wherein the electrically conductive material may thermally heat the antifuse material.

12. The method of claim 7, wherein the core is an air gap.

* * * * *